United States Patent
McTigue et al.

(10) Patent No.: US 9,316,669 B2
(45) Date of Patent: Apr. 19, 2016

(54) MEASUREMENT PROBE PROVIDING DIFFERENT LEVELS OF AMPLIFICATION FOR SIGNALS OF DIFFERENT MAGNITUDE

(71) Applicant: Keysight Technologies, Inc., Minneapolis, MN (US)

(72) Inventors: Michael T. McTigue, Colorado Springs, CO (US); Kenneth W. Johnson, Colorado Springs, CO (US); Edward Vernon Brush, IV, Colorado Springs, CO (US)

(73) Assignee: Keysight Technologies, Inc., Santa Rosa, CA (US)

(*) Notice: Subject to any disclaimer, the term of this patent is extended or adjusted under 35 U.S.C. 154(b) by 249 days.

(21) Appl. No.: 13/930,179

(22) Filed: Jun. 28, 2013

(65) Prior Publication Data
US 2015/0002136 A1 Jan. 1, 2015

(51) Int. Cl.
*G01R 19/00* (2006.01)
*G01R 1/067* (2006.01)

(52) U.S. Cl.
CPC ........ *G01R 1/06788* (2013.01); *G01R 1/06766* (2013.01); *G01R 19/0023* (2013.01)

(58) Field of Classification Search
CPC ............................... G01R 1/30; G01R 19/0023
See application file for complete search history.

(56) References Cited

U.S. PATENT DOCUMENTS

| | | | |
|---|---|---|---|
| 4,646,005 A * | 2/1987 | Ryan | 324/123 R |
| 5,274,336 A * | 12/1993 | Crook et al. | 324/690 |
| 6,014,027 A * | 1/2000 | Reichard | 324/623 |
| 6,566,854 B1 * | 5/2003 | Hagmann et al. | 324/117 R |
| 6,707,025 B2 | 3/2004 | Azary et al. | |
| 7,092,644 B2 | 8/2006 | Davidson | |
| 7,167,655 B2 | 1/2007 | Olivier | |
| 7,365,665 B2 | 4/2008 | Pease | |
| 7,550,962 B2 * | 6/2009 | Pollock et al. | 324/126 |
| 2003/0052693 A1 * | 3/2003 | Douglas | 324/525 |
| 2004/0085057 A1 | 5/2004 | McTigue | |
| 2004/0140819 A1 | 7/2004 | McTigue et al. | |
| 2004/0196021 A1 | 10/2004 | McTigue | |
| 2005/0237078 A1 | 10/2005 | Cannon et al. | |
| 2006/0061348 A1 | 3/2006 | Cannon et al. | |
| 2007/0057682 A1 | 3/2007 | McTigue | |
| 2007/0063714 A1 | 3/2007 | McTigue | |
| 2007/0063715 A1 | 3/2007 | Cannon et al. | |
| 2007/0115010 A1 | 5/2007 | McTigue et al. | |
| 2007/0222468 A1 | 9/2007 | McTigue | |
| 2013/0106401 A1 | 5/2013 | Johnson et al. | |
| 2014/0320145 A1 | 10/2014 | Johnson et al. | |

* cited by examiner

*Primary Examiner* — Minh N Tang

(57) ABSTRACT

A measurement probe comprises at least one input port configured to receive an input signal generated in relation to a device under test (DUT), and an amplification unit configured to amplify the input signal with a first gain where the input signal has a first amplitude, and further configured to amplify the input signal with a second gain lower than the first gain where the input signal has a second amplitude greater than the first amplitude.

21 Claims, 13 Drawing Sheets

MEASUREMENT PROBE PROVIDING DIFFERENT LEVELS OF AMPLIFICATION FOR SIGNALS OF DIFFERENT MAGNITUDE

BACKGROUND

A measurement probe is an apparatus that detects signals on a device under test (DUT) and transmits those signals to a measurement instrument. For example, a current probe detects an amount of current flowing through a DUT and transmits a signal indicating the detected current to a measurement instrument such as an oscilloscope.

In certain applications, it may be desirable for a measurement probe to detect signals over a large range of values, i.e., over a high dynamic range. For instance, when characterizing a mobile phone, it may be desirable to detect its current during a low current state, such as a steep state, and during a high current state, such as a signal transmission state. Moreover, it may also be desirable to observe signals at varying levels of scope or resolution, e.g., at a zoomed-in level and a zoomed-out level.

Unfortunately, conventional measurement probes tend to suffer from various shortcomings when it comes to performing measurements over a high dynamic range. As examples, consider conventional current probes used with oscilloscopes. These current probes generally fall into one of two topologies. In a first topology, a low value current sense resistor is placed in series with conductor carrying a current to be measured and then a high impedance differential voltage amplifier is used to measure a voltage across the current sense resistor and deliver a proportional voltage signal to an oscilloscope. In a second topology, a combination Hall effect sensor and transformer are used to sense a magnetic field from a conductor carrying a current and the sensed voltage is amplified to deliver a proportional voltage signal to an oscilloscope. The Hall effect sensor senses from direct current (DC) to some fairly low bandwidth (BW) point and the transformer senses from the low BW point to a full BW of the probe. These two signals are combined to achieve a DC to full bandwidth design.

These conventional current probes generally have limited dynamic range due to noise. In particular, they typically have a noise floor that is constrained by a maximum current they can sense. Accordingly, because their signal to noise ratio (SNR) is limited, if a maximum input range is picked to cover the largest signals, then the equivalent input noise is too large to allow measurement of very small signals.

In consideration of these and other shortcomings of conventional measurement probes, there is a general need for improved approaches for detecting signals over a high dynamic range.

SUMMARY

In a representative embodiment, a measurement probe comprises at least one input port configured to receive an input signal generated in relation to a DUT, and an amplification unit configured to amplify the input signal with a first gain where the input signal has a first amplitude, and further configured to amplify the input signal with a second gain lower than the first gain where the input signal has a second amplitude greater than the first amplitude.

In another representative embodiment, a method of operating a measurement probe comprises receiving an input signal generated in relation to a DUT, amplifying the input signal with a first gain where the input signal has a first amplitude, and amplifying the input signal with a second gain lower than the first gain where the input signal has a second amplitude greater than the first amplitude.

BRIEF DESCRIPTION OF THE DRAWINGS

The described embodiments are best understood from the following detailed description when read with the accompanying drawing figures. Wherever applicable and practical, like reference numerals refer to like elements.

DETAILED DESCRIPTION

Figure 1:
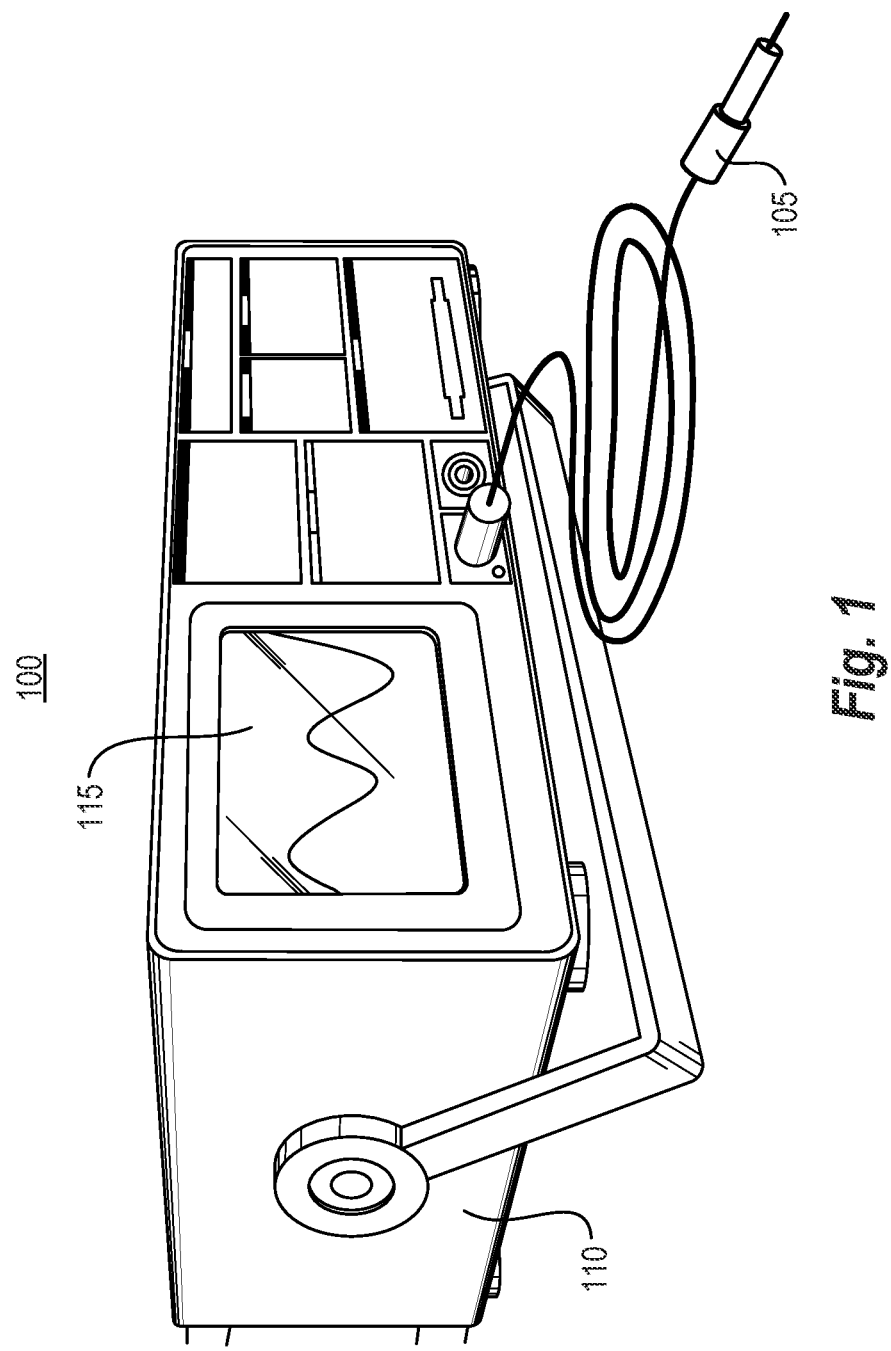
FIG. 1 is a schematic diagram of an oscilloscope and oscilloscope probe according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

The described embodiments relate generally to a measurement probe having a high dynamic range. The measurement probe provides different levels of amplification for signals of different magnitude. In particular, it provides a relatively high level of amplification to signals of relatively low magnitude, and it provides a relatively low level of amplification to signals of relatively high magnitude. This can be accomplished, for instance, by transmitting an input signal through two different signal paths, and providing high amplification in one path and lower amplification in the other path. Alternatively, it can be accomplished by transmitting the input signal through a logarithmic amplifier, which amplifies small signals with a relatively high gain and amplifies large signals with lower gain.

Some of the described embodiments allow viewing and measuring of both small currents and large currents using the same current probe so that a DUT can be evaluated over its complete operation, e.g., from a low power "sleep" mode all the way to a maximum power mode, which is typically a transmit mode for wireless devices or high speed data transfers and processing. In such embodiments, a measurement instrument such as an oscilloscope may selectively show a small or large amplified input signal on a display according to an operating mode of the DUT. In addition, the use of multiple signal paths can avoid limitations posed by a noise floor in single path approaches. For instance, some embodiments use a "zoomed out" signal path, which allows measurement of the larger currents all the way to a maximum current with good SNR for currents in this range, and a "zoomed in" signal path, which allows measurement of very small currents that exist in a low power or "sleep" mode. The "zoomed in" signal path may also have a precision clamping circuit so that the output of the measurement probe does not overdrive the input of the measurement instrument and cause possible overdrive recovery issues. The "zoomed in" signal path may have a large gain and may significantly improve the SNR for measuring very small currents. The improved SNR may come at a cost of tower bandwidth in the "zoomed in" signal path, but this may be an acceptable tradeoff in some applications.

In certain embodiments, a measurement probe comprises at least one input port configured to receive an input signal generated in relation to DUT, and an amplification unit configured to amplify the input signal with a first gain where the input signal has first amplitude, and further configured to amplify the input signal with a second gain lower than the first gain where the input signal has a second amplitude greater than the first amplitude. The amplification unit may comprise, for instance, a logarithmic amplifier. Alternatively, it may comprise a first amplifier configured to receive the input signal through a first signal path, amplify the input signal with the first gain to produce a first amplified input signal, and transmit the first amplified input signal to a first output port, and a second amplifier configured to receive the input signal through a second signal path, amplify the input signal with the second gain to produce a second amplified input signal, and transmit the second amplified input signal to a second output port. The measurement probe may further comprise a clamping circuit disposed in the second signal path between the second amplifier and the second output port and configured to clamp the second amplified input signal between an upper clamping threshold and a lower clamping threshold. The clamping circuit generally operates with substantial gain and amplitude linearity throughout a range between the upper clamping threshold and the lower clamping threshold. In certain embodiments, the measurement probe is a current probe, and the input signal is generated according to a current passing through a sense resistor, which can be disposed either in the DUT or in the measurement probe, for example.

In the description that follows, several embodiments are described with reference to oscilloscopes and oscilloscope probes. However, the described concepts are not limited to oscilloscope technologies and can be applied in other contexts, such as other forms of test or measurement instruments. The described measurement probes, for instance, could be applied in any context where it is desirable to perform measurements over a high dynamic range.

FIG. 1 is a schematic diagram of an oscilloscope and oscilloscope probe according to a representative embodiment. This diagram is presented to illustrate an example context in which probing measurements may be performed over a high dynamic range.

Referring to FIG. 1, a system 100 comprises an oscilloscope probe 105 and an oscilloscope 110. During typical operation of system 100, a user applies a probe tip of oscilloscope probe 105 to a test point of a DUT. Upon making contact with the test point, oscilloscope probe 105 detects a signal at the test point and transmits the signal to oscilloscope 110. Oscilloscope 110 then converts the signal into a waveform to be displayed on a display 115.

Oscilloscope probe 105 can take a variety of alternative forms. For instance, it may be an active probe or a passive probe; it may be a single ended probe or a differential probe. Additionally, although oscilloscope probe 105 is shown as a single lead with a single probe head and tip, it could alternatively be implemented with multiple leads to be connected to a DUT, for instance. Oscilloscope probe 105 typically receives an input signal from the DUT, processes the input signal (e.g., by amplification in an active probe), and then optionally clamps the value of the processed input signal to produce an output signal.

Oscilloscope 110 receives the output signal of oscilloscope probe 105 as an input signal and performs processing on the received input signal. This processing may include, for instance, amplification by an input amplifier and digitization by an ADC. The digitization produces a stream of digital values to be presented on display 115. The input amplifier and/or ADC are typically configured to amplify and/or digitize signals according to a range of values that can be presented on display 115. This range, also referred to as the "full screen range" of display 115, is typically specified by a number of vertical divisions of display 115 and a number of volts per division (V/div). This range can be adjusted by changing the attenuation of oscilloscope probe 105 and/or the input amplifier, for example. In a typical implementation, the full screen range is slightly lower than the dynamic range of the input amplifier and ADC, so these components do not immediately saturate when the input voltage of oscilloscope 110 exceeds the full screen range. For instance, if the dynamic range of the input amplifier and ADC is set to 10V, the full screen range may be set to 8V.

The input amplifier of oscilloscope 110 may be protected by an overdrive protection circuit that is activated when the input signal of oscilloscope 110 exceeds the dynamic range of the input amplifier. The operation of the overdrive protection circuit, however, may introduce distortion into signals that do not exceed the dynamic range of the input amplifier. This distortion is typically present during a period of overdrive recovery following deactivation of the overdrive protection circuit. In general, the distortion may interfere with the observation and measurement of signals of interest. To prevent such interference, oscilloscope probe 105 may comprise an output clamping circuit that restricts its output to within the dynamic range of the input amplifier of oscilloscope 110, effectively preventing the overdrive recovery circuit from being activated. Examples of such an output clamping circuit, along with further details of its operation, are described below with reference to other figures.

Figure 2:
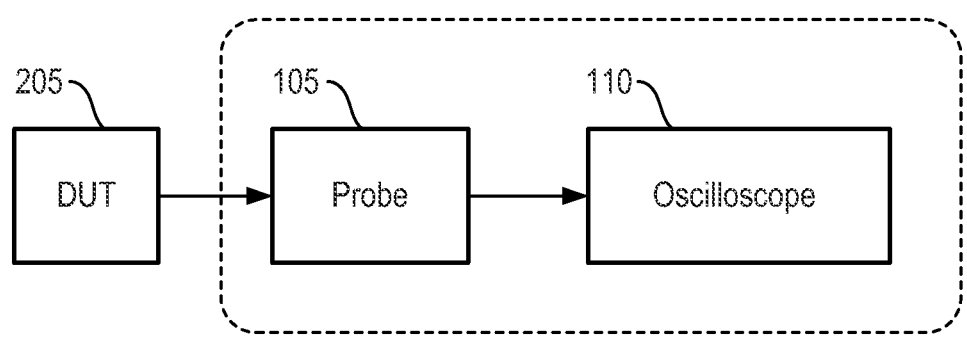
FIG. 2 is a block diagram of the oscilloscope and oscilloscope probe of FIG. 1 according to a representative embodiment.

FIG. 2 is a block diagram of oscilloscope 110 and oscilloscope probe 105 of FIG. 1 according to a representative embodiment. This diagram is presented as a simple illustration of the signal flow from a DUT 205 to oscilloscope 110.

Referring to FIG. 2, where oscilloscope probe 105 is in contact with DUT 205, a signal is transmitted from DUT 205 to oscilloscope probe 105. Within oscilloscope probe 105, the signal may be transmitted through different signal paths with different gain in order to provide different levels of amplification to signals of different magnitude. Alternatively, the signal may be transmitted through a logarithmic amplifier to provide different levels of amplification to signals of different magnitude. The signal is also optionally transmitted through a voltage clamping circuit to ensure that it does not exceed predetermined upper and lower clamping threshold voltages. Then, the signal is transmitted to oscilloscope 110 where it is amplified, digitized, and presented on display 115.

Figure 3:
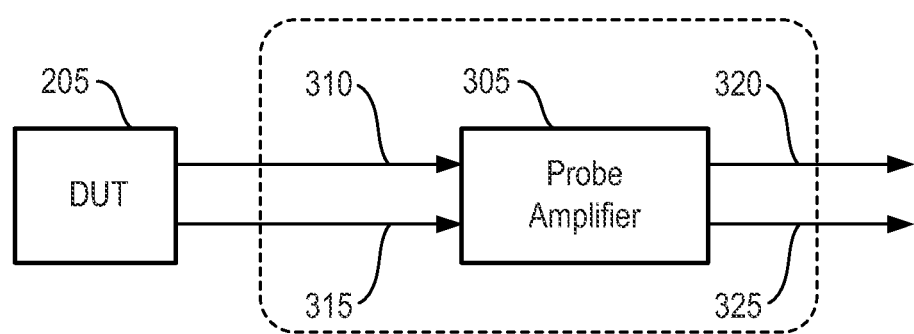
FIG. 3 is a block diagram of the oscilloscope probe of FIG. 2 according to a representative embodiment.

FIG. 3 is a block diagram of oscilloscope probe 105 of FIG. 2 according to a representative embodiment.

Referring to FIG. 3, oscilloscope probe 105 comprises a probe amplifier 305 having a pair of leads 310 and 315 connected to DUT 205 and a pair of output terminals 320 and 325. Leads 310 and 315 are typically connected across a sense resistor, and they are used to detect a current flowing through DUT 205. Probe amplifier 305 receives the input signal through leads 310 and 315 and amplifies the input signal to produce two output signals at respective output terminals 320 and 325. In the example of FIG. 3, probe amplifier 305 applies a relatively low amount of amplification to the input signal to produce a first one of the output signals on output terminal 320, and it applies a relatively high amount of amplification to the input signal to produce a second one of the output signals on output terminal 325. Optionally, a clamping circuit may be applied to the second output signal to prevent the second output signal from exceeding a lower or upper clamping threshold.

The use of two different signal paths for different levels of amplification allows probe amplifier 305 to operate with relatively high gain in one path to provide output signals with relatively low SNR. Under these conditions, oscilloscope probe 105 can be used to detect and output signals of relatively small magnitude. At the same time, if the amplified input signal becomes relatively large such that it exceeds the upper and/or lower clamping threshold, the optional clamping circuit will prevent oscilloscope probe 105 from outputting the large signal to oscilloscope 110, thus preventing overdrive of the oscilloscope channel which can cause distortion.

Although not illustrated in FIG. 3, oscilloscope probe 105 may further comprise mechanisms for adjusting various characteristics of probe amplifier 305 and/or the clamping circuit. For instance, it may comprise mechanisms for lowering the gain of probe amplifier 305 and/or disabling operation of clamping circuit to analyze larger input signals. Additionally, it may comprise mechanisms for adjusting the upper and lower clamping thresholds, e.g., for compatibility with an oscilloscope or process having a different overdrive protection threshold.

Figure 4A:
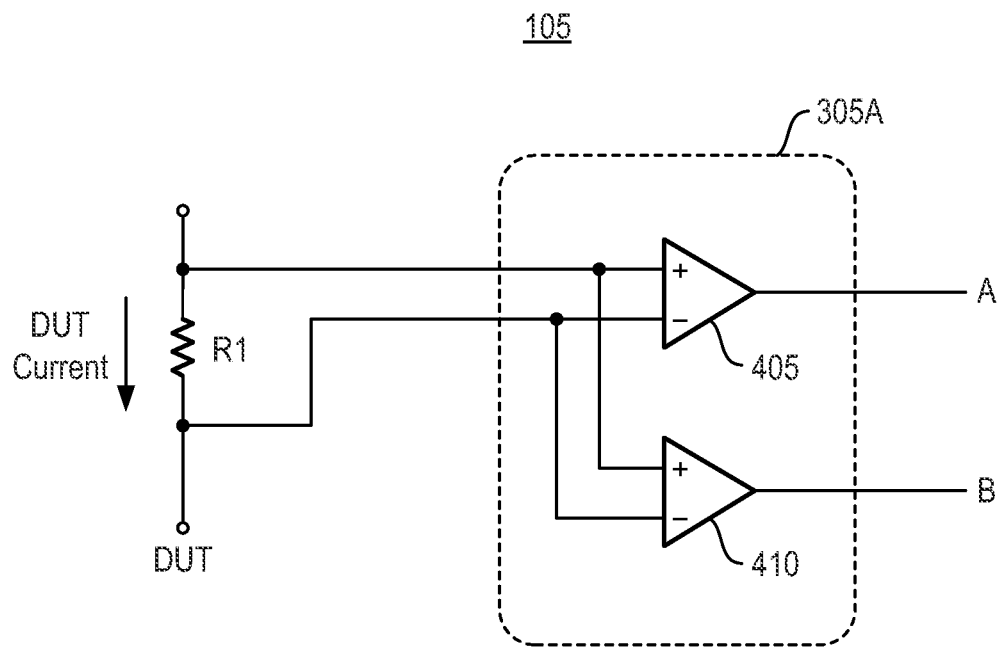
FIG. 4A is a circuit diagram of the oscilloscope probe of FIG. 2 according to a representative embodiment.
Figure 4B:
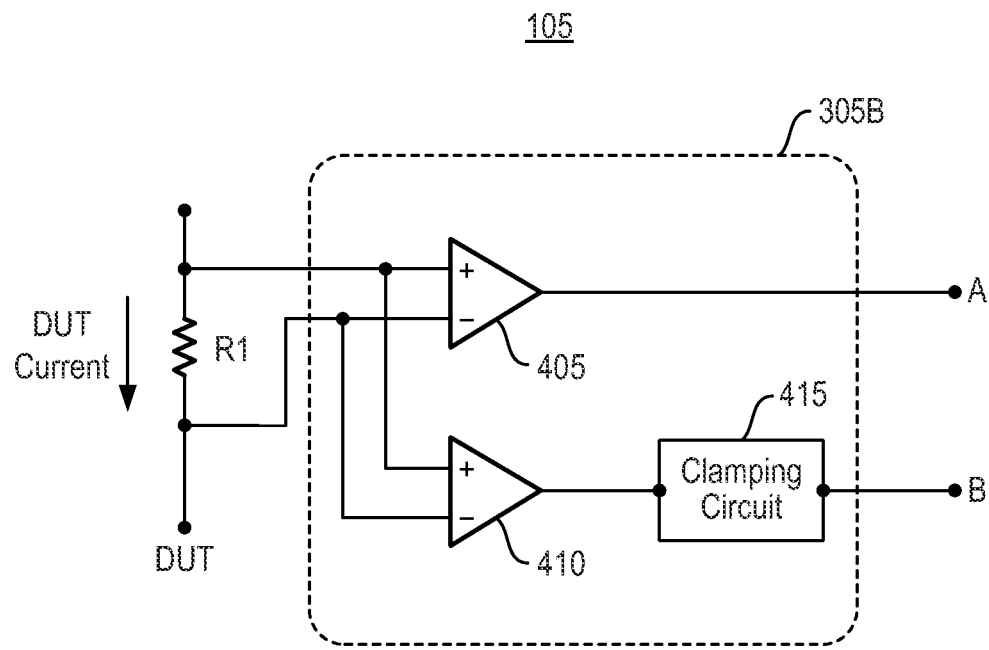
FIG. 4B is a circuit diagram of the oscilloscope probe of FIG. 2 according to another representative embodiment.
Figure 4C:
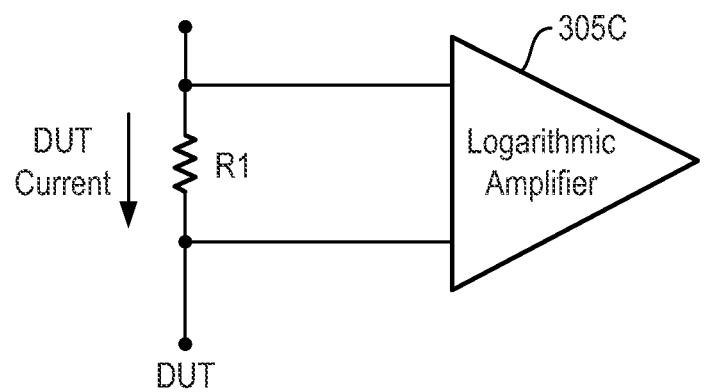
FIG. 4C is a circuit diagram of the oscilloscope probe of FIG. 2 according to a representative embodiment.

FIG. 4A is a circuit diagram of oscilloscope probe 105 of FIG. 2 according to a representative embodiment. FIG. 4B is a circuit diagram of oscilloscope probe 105 of FIG. 2 according to another representative embodiment. FIG. 4C is a circuit diagram of oscilloscope probe 105 of FIG. 2 according to a representative embodiment. These diagrams represent a few possible variations of the implementation of oscilloscope probe 105. In the diagrams of FIGS. 4A-4C, three different variations of probe amplifier 305 are labeled as probe amplifier 305A, probe amplifier 305B, and probe amplifier 305C, respectively.

Referring to FIG. 4A oscilloscope probe 105 is connected to two oscilloscope channels A and B. Channel A is used for observing an input signal at a broad scale (i.e., a "zoomed out" scale) and channel B is used for observing small portions of the input signal on a magnified scale ("zoomed in" scale). Probe amplifier 305A receives the input signal through a pair of probe leads connected to a DUT, and it transmits the input signal to the respective channels A and B through amplifiers 405 and 410 arranged in parallel. As illustrated in FIG. 4A, the input signal represents the amount of current flowing through a sense resistor R1, which can be part of the DUI or part of oscilloscope probe 105, for instance.

Amplifier 405 is a lower gain (i.e., a first gain) differential amplifier, typically with moderate bandwidth (i.e., a first bandwidth), and amplifier 410 is a higher gain (i.e., a second gain) differential amplifier, typically with lower bandwidth (i.e., a second bandwidth) simply due to the high gain needed and limited gain bandwidth product of available amplifiers. If the second bandwidth is more than needed then the receiving oscilloscope can low pass filter the signal from the higher gain amplifier to reduce the observed noise level. Amplifiers 405 and 410 are typically instrumentation amplifiers. In general, one of the amplifiers may have lower noise than the other, although not necessarily.

Referring to FIG. 4B, to prevent channel B from being overdriven or saturated by signals output through the higher gain differential amplifier, a clamping circuit 415 is placed at the output of amplifier 410. Although not shown in the figures, switching circuits can be added at the outputs of the low and high gain differential amplifiers so the "zoomed out" and "zoomed in" signal paths can be reversed if desired. Additionally, switching circuits can be added so that the clamping circuit can be diverted, thus switching off the clamping behavior.

The two channel concept of FIGS. 4A and 4B represents one possible approach to the problem of viewing and measuring very small currents and fairly high currents with the same current probe. As indicated above, this approach may allow DUTs to be evaluated over their complete operation from low power "sleep" modes all the way to maximum power modes. As also indicated above, a potential benefit of this high dynamic range oscilloscope probe compared to conventional probes is that it can avoid measuring current with only one signal path, which generally has SNR limitations. For example, it can use the "zoomed out" signal path to measure the larger currents all the way to the maximum current with good SNR for currents in this range, and it can use the "zoomed in" signal path to measure very small currents that exist in a low power or "sleep" mode. Additionally, the use of clamping circuit 415 in the "zoomed in" signal path prevents oscilloscope probe 105 from overdriving the oscilloscope input and causing possible overdrive recovery issues for the oscilloscope. In FIGS. 4A and 4B, the "zoomed in" signal path has a relatively large gain, and typically limited bandwidth.

Referring to FIG. 4C, probe amplifier 305C adopts an alternative approach in which amplifiers 405 and 410 are replaced by a single logarithmic amplifier. The logarithmic amplifier has a transfer function that applies a higher gain to signals of lower magnitude and a lower gain to signals of higher magnitude. As suggested by the name, the gain varies logarithmically as a function of the input signal magnitude.

Figure 5:
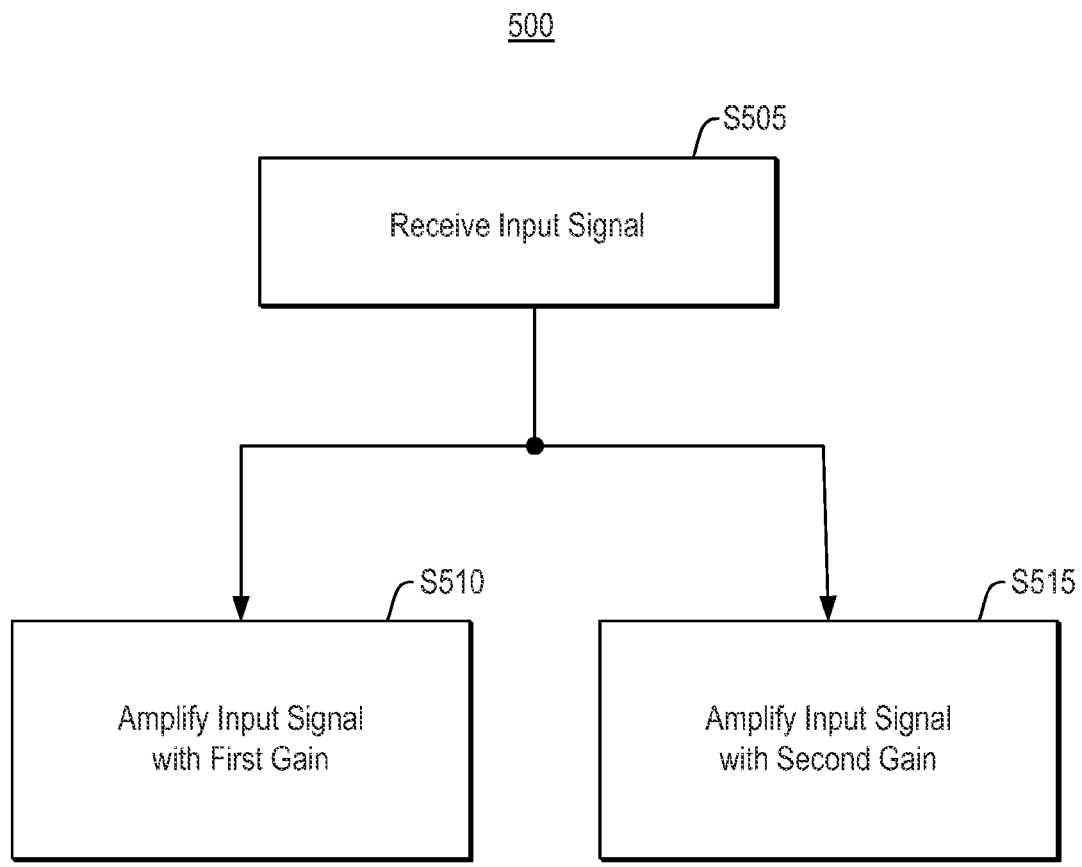
FIG. 5 is a flowchart illustrating a method of operating a measurement probe according to a representative embodiment.

FIG. 5 is a flowchart illustrating a method 500 of operating a measurement probe according to a representative embodiment. This method can be performed, for instance, by a measurement probe such as any of those illustrated in FIGS. 1 through 4. In the description that follows, example method operations will be indicated by parentheses.

Referring to FIG. 5, the method comprises receiving an input signal from a DUT (S505). The input signal typically takes the form of a voltage pair indicating the magnitude of a current through a sense resistor. The method further comprises amplifying the input signal with a first gain where the input signal has a first amplitude (S510), and amplifying the input signal with a second gain lower than the first gain where the input signal has a second amplitude greater than the first amplitude (S515). As illustrated by FIGS. 4A through 4C, operations S510 and S515 can be performed either by different amplifiers located in different signal paths, or they can be performed by a single logarithmic amplifier.

An example application of this method is the testing of circuits using a battery drain analyzer. For instance, a user may use the method when testing a breakout board containing circuits for an electronic device such as a mobile phone. The breakout board may include sense resistors at various circuit locations in order to facilitate measurement of current consumption by various features of the device. During a test, the user may apply the measurement probe across each of the sense resistors to determine the current consumption of the different features. Moreover, these measurements may be performed with the device in different modes, such as sleep or transmit modes. Accordingly, the measurement probe may require high dynamic range capability to perform accurate measurements in the various modes. As an alternative to including the sense resistors on the breakout board, the measurement probe may include an internal sense resistor, or it may be used in conjunction with a make before break connector configured to produce the input signal across the probe input leads.

Figure 6A:
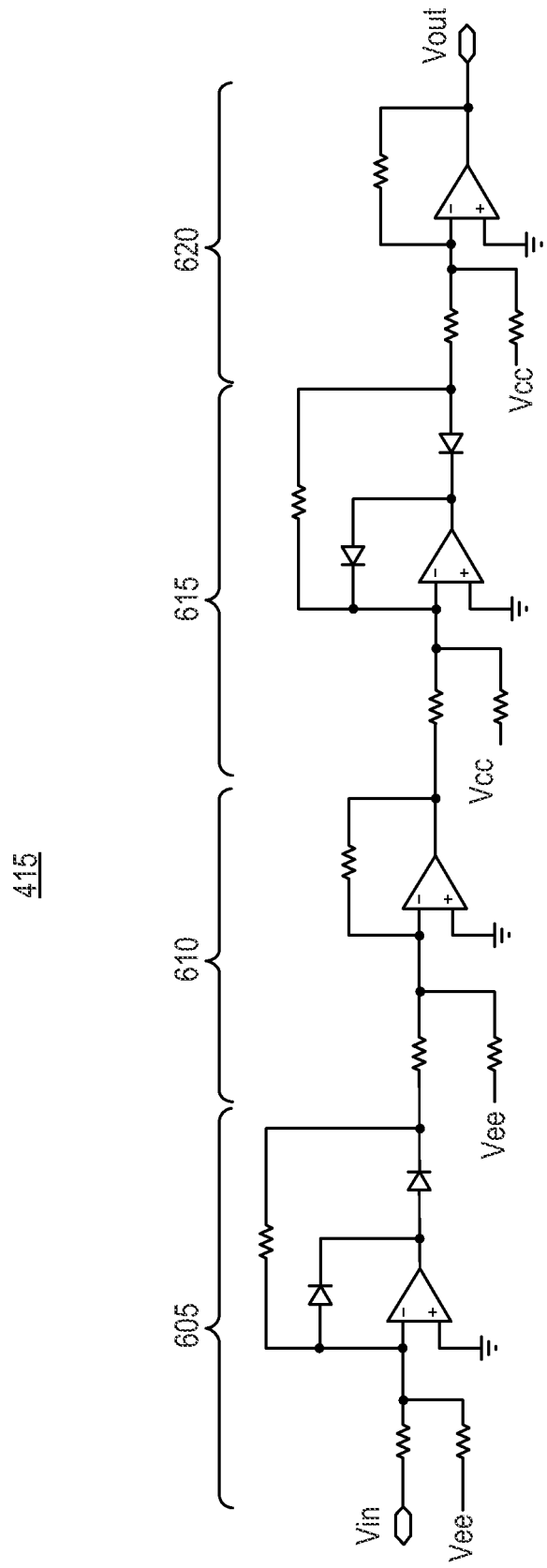
FIG. 6A is a circuit diagram of a clamping circuit in the oscilloscope probe of FIG. 4B according to a representative embodiment.
Figure 6B:
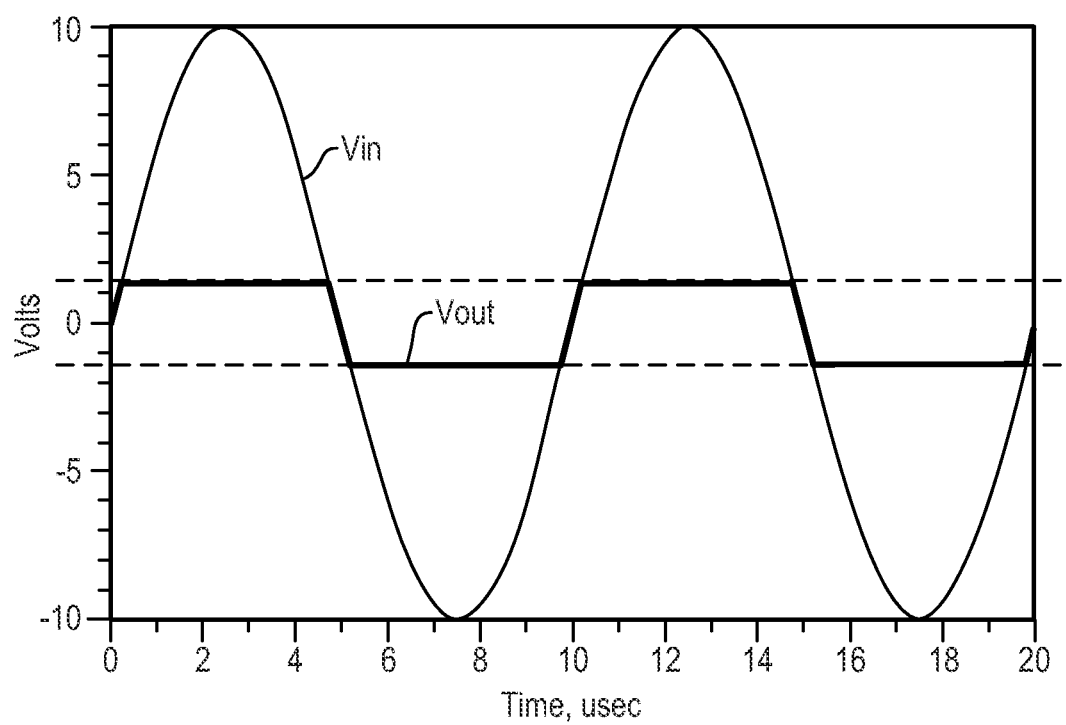
FIG. 6B is a voltage diagram illustrating the operation of the clamping circuit of FIG. 6A according to a representative embodiment.

FIG. 6A is a circuit diagram of clamping circuit 415 in the oscilloscope probe of FIG. 4 according to a representative embodiment, and FIG. 6B is a voltage diagram illustrating the operation of the damping circuit of FIG. 6A according to a representative embodiment. A general description of clamping circuit 415 will be presented with reference to FIGS. 6A and 6B, and a more detailed description of individual features of clamping circuit 415 will be presented with reference to FIGS. 7 through 10.

In the examples of FIGS. 6A and 6B, clamping circuit 415 comprises a sequence of sub-circuits that are configured, collectively, to clamp an input signal Vin to produce an output signal Vout bounded by upper and lower clamping thresholds. For illustration purposes, input signal Vin is shown as a simple sinusoid in the example of FIG. 6B and subsequent figures. In practice, however, the input signal of clamping circuit could take any arbitrary form. Also for illustration purposes, the upper and lower clamping thresholds are shown by dotted lines at +1.4V and −1.4V, respectively, in the example of FIG. 6B and the subsequent figures. In practice, however, these thresholds could be adjusted arbitrarily.

Referring to FIG. 6A, the sub-circuits of clamping circuit 415 comprise first precision rectifier 605, a first level shifter 610, a second precision rectifier 615, and a second level shifter 620. These circuits are arranged in sequence as illustrated FIG. 6A, and are configured, respectively, to clamp a positive portion of input signal Vin, to perform level shifting in coordination with the positive clamping, to clamp a negative portion of input signal Vin, and to perform level shifting in coordination with the negative clamping. First and second precision rectifiers 605 and 615 each behave like an ideal diode and a rectifier. In the illustrated design, however, each of these precision rectifiers has been modified to include an input resistor that produces a DC shift on nonzero output voltages. Each of first and second level shifters 610 and 620 has an input resistor that produces a corresponding DC shift. The values of these input resistors can be adjusted, in a coordinated fashion, to determine the upper and lower clamping thresholds.

Referring to FIG. 6B, where input signal Vin is within the upper and lower clamping thresholds, output signal Vout has substantially the same shape as input signal Vin. Otherwise, output signal Vout is clamped at +/−1.4 volts. Because output signal Vout has substantially the same shape as input signal Vin within the thresholds, portions of Vin within the thresholds can be observed with reliability on oscilloscope 110 even if some portions of Vin exceed the thresholds. More generally, clamping circuit 415 can be said to exhibit substantially linearity of its gain and amplitude throughout the region between the upper and lower clamping thresholds. The similarity between input signal Vin and output signal Vout is a consequence of this substantial linearity.

Figure 7A:
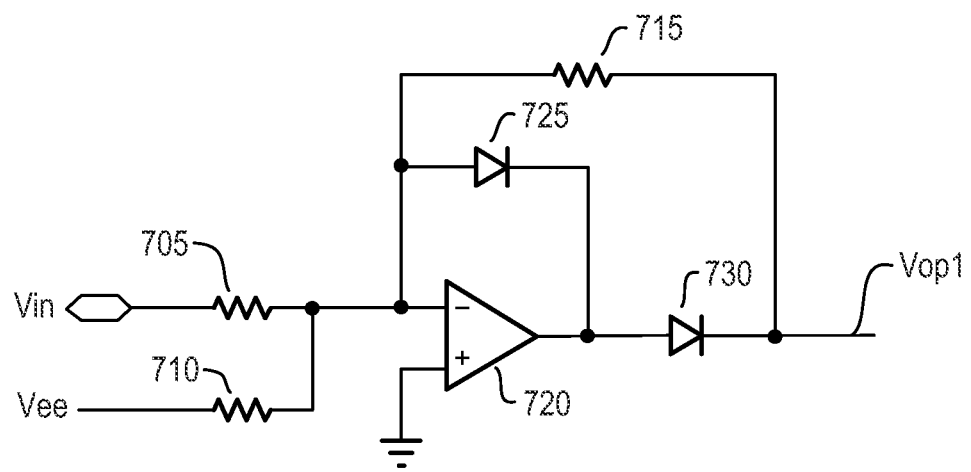
FIG. 7A is a circuit diagram of a first precision rectifier in the clamping circuit of FIG. 6A according to a representative embodiment.
Figure 7B:
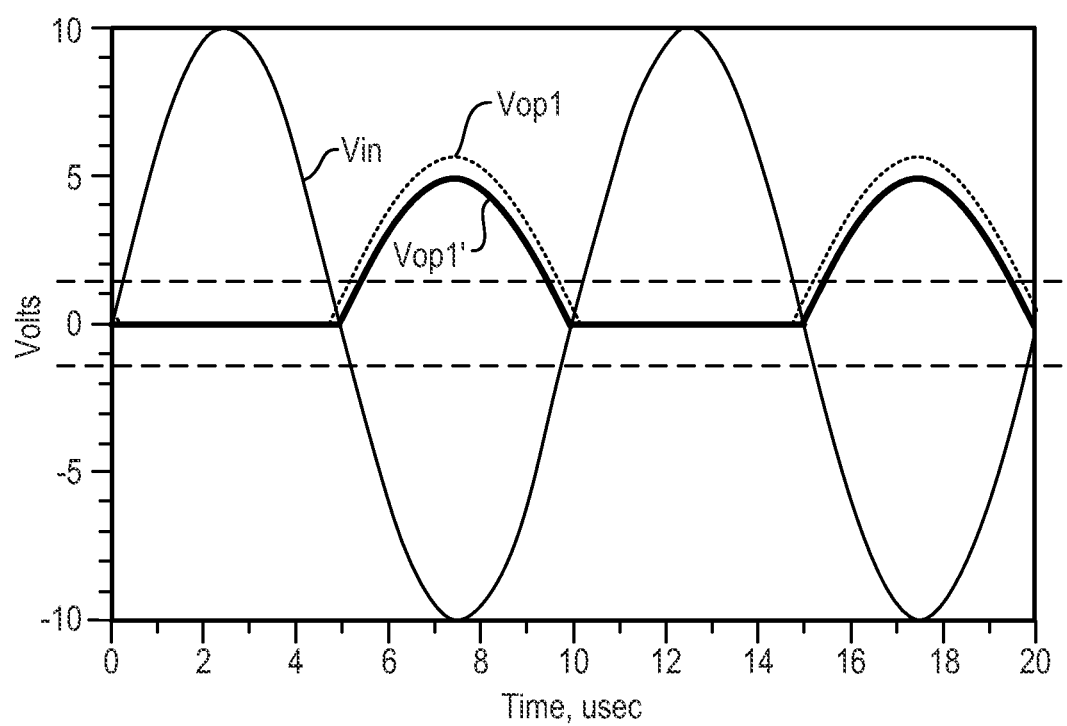
FIG. 7B is a voltage diagram illustrating the operation of the first precision rectifier of FIG. 7A according to a representative embodiment.

FIG. 7A is a circuit diagram of first precision rectifier 605 in clamping circuit 415 of FIG. 6A according to a representative embodiment, and FIG. 7B is a voltage diagram illustrating the operation of first precision rectifier 605 of FIG. 7A according to a representative embodiment.

Referring to FIGS. 7A and 7B, first precision rectifier 605 receives input signal Vin and produces an output signal Vop1. Output signal Vop1 is produced by a combination of shifting, inverting, attenuating, and clamping of input signal Vin. First precision rectifier 605 comprises first, second and third resistors 705, 710 and 715, an operational amplifier (op-amp 720) arranged in an inverting configuration, and first and second diodes 725 and 730. Second resistor 710 is connected to a negative supply voltage Vee, and the remaining features are connected to each other as shown in FIG. 7A.

During typical operation of first precision rectifier 605, input voltage Vin is first modified according to the behavior of an inverting op amp across first resistor 705. The negative supply voltage Vee and second resistor 710 create a DC shift at Vop1. The value of the modified voltage is determined by, among other things, the resistance values of the resistors and the magnitude of negative supply voltage Vee. These and other parameters can be calibrated in combination with other features of clamping circuit 415 to produce the desired operating characteristics. The modified voltage is inverted, clamped, and attenuated by the combination of op-amp 720, third resistor 715, and first and second diodes 725 and 730.

As illustrated in FIG. 7B, the operation of first precision rectifier 605 clamps all negative voltages at zero, which ultimately results in the clamping of positive portions of input voltage Vin. This clamping also relies on the introduction of a DC offset to input voltage Vin. To illustrate the consequence of omitting the DC offset, FIG. 7B shows a modified output voltage Vop1', which has a value of zero volts for all positive values of input voltage Vin.

Figure 8A:
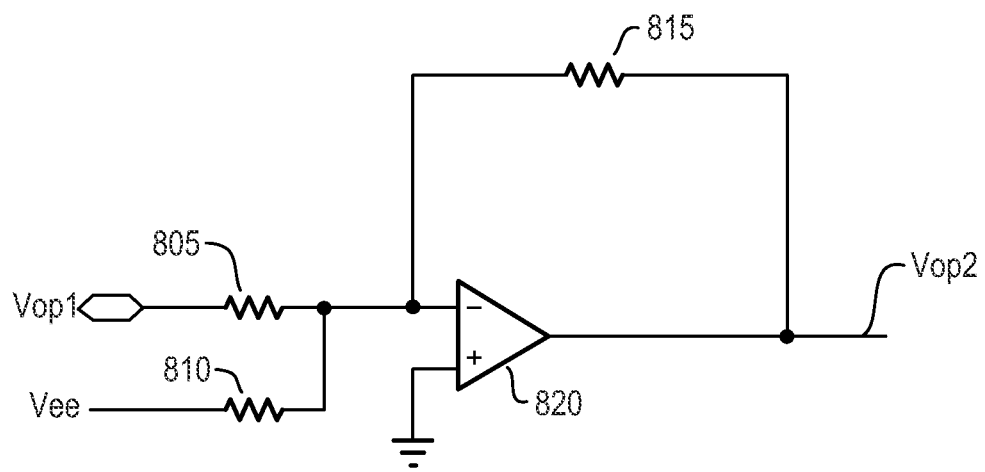
FIG. 8A is a circuit diagram illustrating a first level shifter in the clamping circuit of FIG. 6A according to a representative embodiment.
Figure 8B:
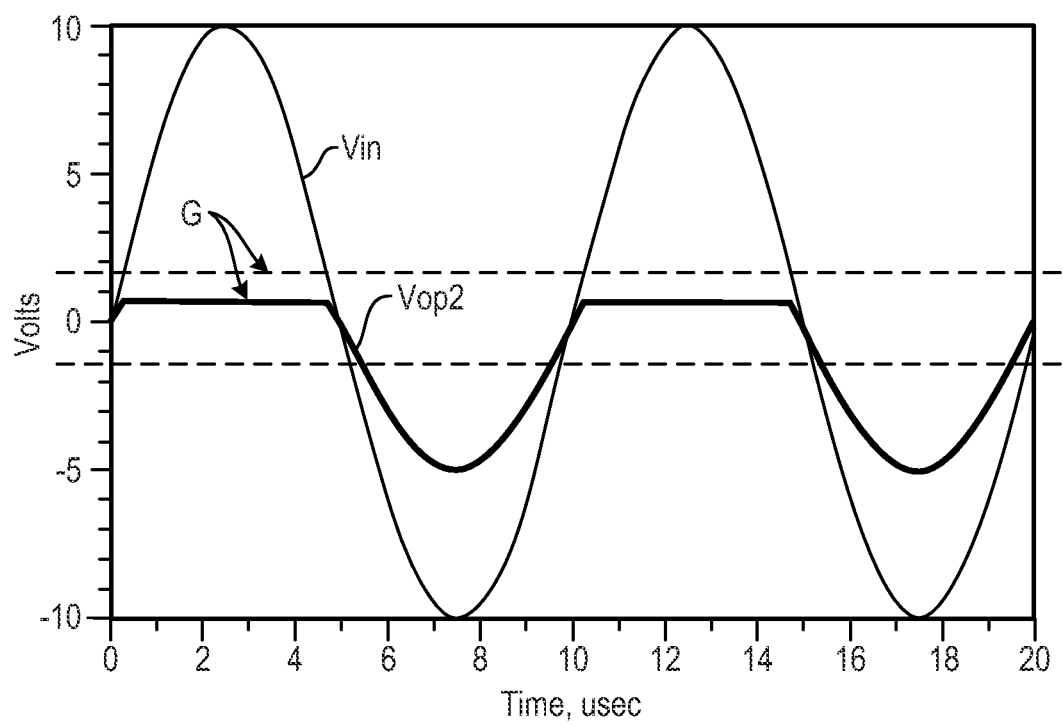
FIG. 8B is a voltage diagram illustrating the operation of the first level shifter of FIG. 8A according to a representative embodiment.

FIG. 8A is a circuit diagram of first level shifter 610 in clamping circuit 415 of FIG. 6A according to a representative embodiment, and FIG. 8B is a voltage diagram illustrating the operation of first level shifter 610 of FIG. 8A according to a representative embodiment.

Referring to FIGS. 8A and 8B, first level shifter 610 receives output signal Vop1 from first precision rectifier 605 and produces an output signal Vop2. Output signal Vop2 is produced by a combination of shifting and inverting of output signal Vop2. First level shifter 610 comprises first, second and third resistors 805, 810 and 815, and an op-amp 820 arranged in an inverting configuration. Second resistor 810 is connected to negative supply voltage Vee, and the remaining features are connected to each other as shown in FIG. 8A.

During typical operation of first level shifter 610, output voltage Vop1 is first modified according to the behavior of an inverting op amp across third resistor 815. The negative supply voltage Vee and second resistor 810 create a DC shift at Vop2. The value of the modified voltage is determined by, among other things, the resistance values of the resistors and the magnitude of negative supply voltage Vee. These and other parameters can be calibrated in combination with other features of clamping circuit 415 to produce the desired operating characteristics. The modified voltage is inverted and attenuated by the combination of op-amp 820 and third resistor 815.

As illustrated by FIG. 8B, output signal Vop2 comprises a clamped portion that corresponds to positive values of input signal Vin. As illustrated by a gap "G" between the clamped portion and the dotted tines representing the upper clamping threshold, output signal Vop2 must be subsequently scaled up in order for clamping to occur at the upper clamping threshold. This scaling occurs through operation of second precision rectifier 615 and second level shifter, as illustrated by FIGS. 9 and 10.

Figure 9:
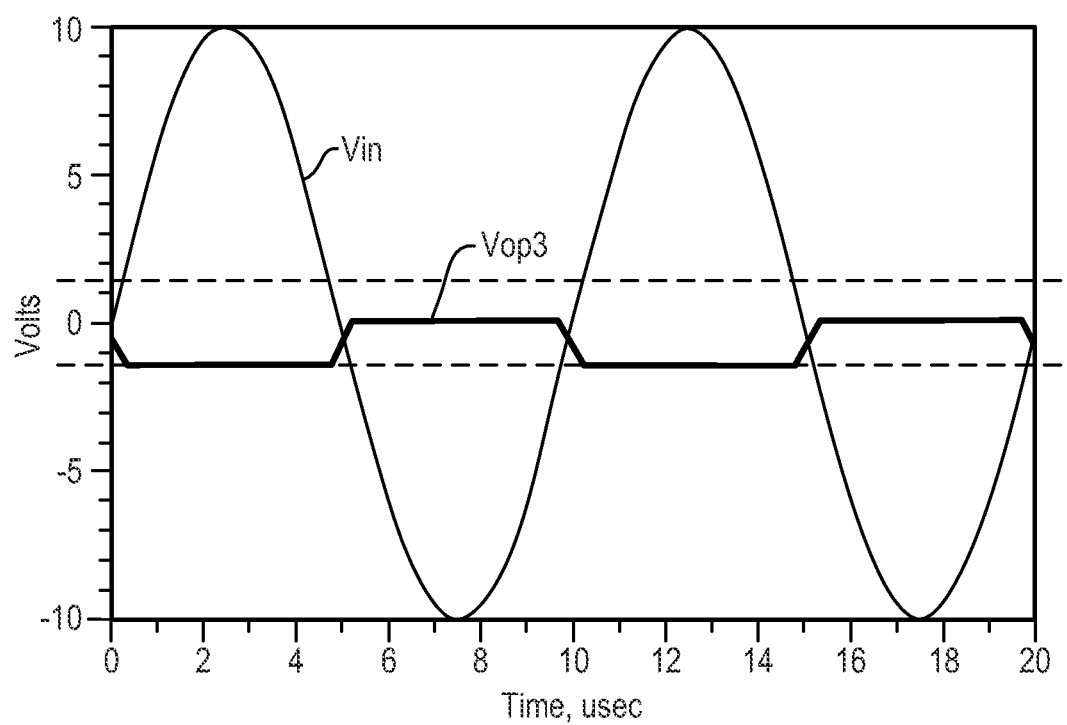
FIG. 9 is a voltage diagram illustrating the operation of a second precision rectifier in the clamping circuit of FIG. 6A according to a representative embodiment.

FIG. 9 is a voltage diagram illustrating the operation of second precision rectifier 615 of FIG. 6A according to a representative embodiment. The basic configuration of second precision rectifier 615 is similar to that of first precision rectifier 605 as described in relation to FIG. 7A, except that the direction of the diodes is reversed, the supply voltage creating a DC shift is positive, and the values of the resistors may be modified as needed to achieve a desired attenuation and DC shift. The operation of such a circuit will be well understood by those skilled in the art based on the above description.

As illustrated in FIG. 9, second precision rectifier 615 produces an output signal Vop3 by a combination of shifting, inverting, attenuating, and clamping of output signal Vop2. These operations are similar to those performed by first precision rectifier 605, except that they produce clamping on portions of output signal Vop2 that correspond to negative voltages in input signal Vin.

Figure 10:
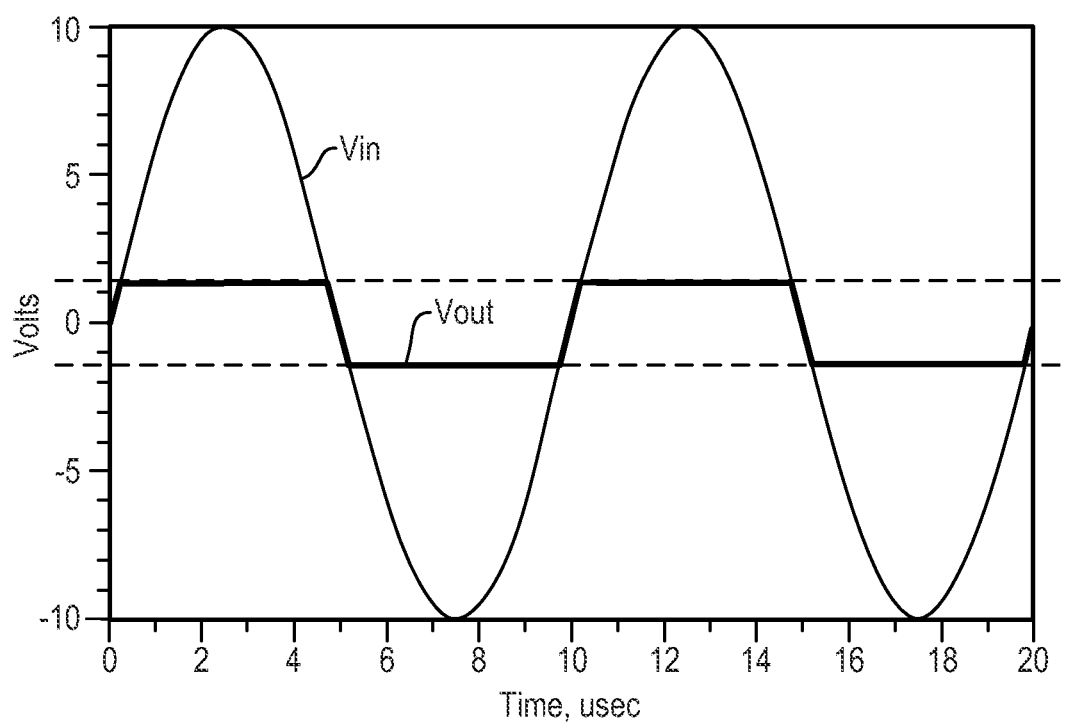
FIG. 10 is a voltage diagram illustrating the operation of a second level shifter in the clamping circuit of FIG. 6A according to a representative embodiment.

FIG. 10 is a voltage diagram illustrating the operation of second level shifter 620 of FIG. 6A according to a representative embodiment. The basic configuration of second level shifter 620 is similar to that of first level shifter 610 as described in relation to FIG. 6A, except that the values of the resistors may be modified as needed to achieve a desired DC shift. The operation of such a circuit will be well understood by those skilled in the art based on the above description.

As illustrated in FIG. 10, second level shifter 620 produces output signal Vout by a combination of shifting, scaling, and inverting output signal Vop3. As indicated by the alignment between output voltage Vout and the dotted lines in FIG. 10, the operation of second level shifter 620 scales output signal Vop3 to the level of the upper and lower clamping thresholds.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A measurement probe, comprising:
   at least one input port configured to receive an input signal generated in relation to a device under test (DUT); and
   an amplification unit configured to amplify the input signal with a first gain where the input signal has a first amplitude, and further configured to amplify the input signal with a second gain lower than the first gain where the input signal has a second amplitude greater than the first amplitude.

2. The measurement probe of claim 1, wherein the input signal is generated according to a current passing through a sense resistor.

3. The measurement probe of claim 2, wherein the sense resistor is disposed in the measurement probe.

4. The measurement probe of claim 2, wherein the sense resistor is disposed in the DUT.

5. The measurement probe of claim 1, wherein the measurement probe is an oscilloscope probe.

6. The measurement probe of claim 1, wherein the amplification unit comprises a logarithmic amplifier.

7. A method of operating a measurement probe, comprising:
   receiving an input signal generated in relation to a device under test (DUT);
   amplifying the input signal with a first gain where the input signal has a first amplitude, the amplifying the input signal with the first gain comprising amplifying the input signal with first and second amplifiers arranged in parallel, wherein the first amplifier amplifies the input signal with the first gain to produce a first amplified input signal, and the second amplifier amplifies the input signal with the second gain to produce a second amplified input signal;
   amplifying the input signal with a second gain lower than the first gain where the input signal has a second amplitude greater than the first amplitude; and
   clamping the first amplified input signal between an upper clamping threshold and a lower clamping threshold.

8. The method of claim 7, wherein the measurement probe is an oscilloscope probe.

9. The method of claim 7, wherein the first and second amplifiers are instrumentation amplifiers.

10. The method of claim 7, further comprising selectively displaying the first or second amplified input signal on a display of a measurement instrument according to an operating mode of the DUT.

11. The method of claim 7, wherein amplifying the input signal with the first or second gain comprises amplifying the input signal with logarithmic amplifier.

12. The method of claim 7, wherein the input signal comprises a voltage across a sense resistor.

13. A measurement probe, comprising:
   at least one input port configured to receive an input signal generated in relation to a device under test (DUT); and
   an amplification unit configured to amplify the input signal with a first gain where the input signal has a first amplitude, and further configured to amplify the input signal with a second gain lower than the first gain where the input signal has a second amplitude greater than the first amplitude, the amplification unit comprising: a first amplifier configured to receive the input signal through a first signal path, amplify the input signal with the first gain to produce a first amplified input signal, and transmit the first amplified input signal to a first output port; and a second amplifier configured to receive the input signal through a second signal path, amplify the input signal with the second gain to produce a second amplified input signal, and transmit the second amplified input signal to a second output port; and a clamping circuit disposed in the second signal path between the second amplifier and the second output port and configured to clamp the second amplified input signal between an upper clamping threshold and a lower clamping threshold.

14. The measurement probe of claim 13, wherein the first and second amplifiers are instrumentation amplifiers.

15. The measurement probe of claim 13, wherein the clamping circuit operates with substantial gain and amplitude linearity throughout a range between the upper clamping threshold and the lower clamping threshold.

16. The measurement probe of claim 13, wherein the first amplifier has lower noise than the second amplifier.

17. The measurement probe of claim 13, wherein the input signal is generated according to a current passing through a sense resistor.

18. The measurement probe of claim 17, wherein the sense resistor is disposed in the measurement probe.

19. The measurement probe of claim 17, wherein the sense resistor is disposed in the DUT.

20. The measurement probe of claim 13, wherein the measurement probe is an oscilloscope probe.

21. The measurement probe of claim 13, wherein the amplification unit comprises a logarithmic amplifier.

* * * * *